(12) United States Patent
Oh et al.

(10) Patent No.: US 7,550,388 B2
(45) Date of Patent: Jun. 23, 2009

(54) POLISHING COMPOSITION AND POLISHING METHOD

(75) Inventors: Junhui Oh, Inuyama (JP); Atsunori Kawamura, Owariasahi (JP); Tsuyoshi Matsuda, Kasugai (JP); Tatsuhiko Hirano, Kakamigahara (JP); Kenji Sakai, Nagoya (JP); Katsunobu Hori, Iwakura (JP)

(73) Assignee: Fujima Incorporated, Aichi (JP)

( * ) Notice: Subject to any disclaimer, the term of this patent is extended or adjusted under 35 U.S.C. 154(b) by 221 days.

(21) Appl. No.: 11/085,612

(22) Filed: Mar. 21, 2005

(65) Prior Publication Data

US 2005/0215060 A1     Sep. 29, 2005

(30) Foreign Application Priority Data

Mar. 24, 2004  (JP)  ............................. 2004-087261

(51) Int. Cl.
*H01L 21/302*    (2006.01)

(52) U.S. Cl. ....................... 438/692; 438/693

(58) Field of Classification Search ................ 438/689, 438/690, 691, 692, 693; 252/79.1–79.5
See application file for complete search history.

(56) References Cited

U.S. PATENT DOCUMENTS

| | | | |
|---|---|---|---|
| 5,391,258 A | 2/1995 | Brancaleoni et al. | |
| 5,428,721 A | 6/1995 | Sato et al. | |
| 5,476,606 A | 12/1995 | Brancaleoni et al. | |
| 5,575,885 A | 11/1996 | Hirabayashi et al. | |
| 5,770,095 A | 6/1998 | Sasaki et al. | |
| 5,858,813 A | 1/1999 | Scherber et al. | |
| 5,954,997 A | 9/1999 | Kaufman et al. | |
| 6,004,188 A | 12/1999 | Roy | |
| 6,126,853 A | 10/2000 | Kaufman et al. | |
| 6,428,721 B1 | 8/2002 | Ina et al. | |
| 6,432,828 B2 | 8/2002 | Kaufman et al. | |
| 6,440,186 B1 | 8/2002 | Sakai et al. | |
| 6,568,996 B2 | 5/2003 | Kobayashi et al. | |
| 6,679,929 B2 | 1/2004 | Asano et al. | |
| 6,689,692 B1 | 2/2004 | Grover et al. | |
| 6,773,476 B2 | 8/2004 | Sakai et al. | |
| 6,814,767 B2 | 11/2004 | Hirano | |
| 6,838,016 B2 | 1/2005 | Sakai et al. | |
| 2002/0013122 A1* | 1/2002 | Sugaya et al. | ............... 451/41 |
| 2002/0095872 A1 | 7/2002 | Tsuchiya et al. | |
| 2003/0051413 A1* | 3/2003 | Sakai et al. | ............... 51/307 |
| 2003/0166337 A1 | 9/2003 | Wang et al. | |

(Continued)

FOREIGN PATENT DOCUMENTS

JP        7233485        9/1995

(Continued)

*Primary Examiner*—Kin-Chan Chen
(74) *Attorney, Agent, or Firm*—Craig Metcalf; Kirton & McConkie

(57) ABSTRACT

A polishing composition contains a deterioration inhibitor for inhibiting deterioration of polishing capability of the polishing composition, an abrasive, and water. The deterioration inhibitor is at least one selected from polysaccharide and polyvinyl alcohol. The polysaccharide is starch, amylopectin, glycogen, cellulose, pectin, hemicellulose, pullulan, or elsinan. Among them, pullulan is preferable. The abrasive is at least one selected from aluminum oxide and silicon dioxide, preferably at least one selected from fumed silica, fumed alumina, and colloidal silica. The polishing composition can be suitably used in polishing for forming wiring a semiconductor device.

13 Claims, 1 Drawing Sheet

U.S. PATENT DOCUMENTS

| | | |
|---|---|---|
| 2003/0219982 A1* | 11/2003 | Kurata et al. .................. 438/692 |
| 2004/0067649 A1* | 4/2004 | Hellring et al. ............. 438/689 |
| 2004/0084414 A1 | 5/2004 | Sakai et al. |
| 2005/0050803 A1* | 3/2005 | Amanokura et al. .......... 51/309 |
| 2005/0108949 A1 | 5/2005 | Matsuda et al. |
| 2006/0143990 A1* | 7/2006 | Ono et al. ..................... 51/307 |
| 2006/0216939 A1* | 9/2006 | Uchida et al. ............... 438/692 |

FOREIGN PATENT DOCUMENTS

| | | |
|---|---|---|
| JP | 8083780 | 3/1996 |
| JP | 11021546 | 1/1999 |
| JP | 2003-100678 | 4/2003 |
| WO | WO - 00/13217 | 3/2000 |
| WO | WO - 00/17006 | 3/2000 |
| WO | WO - 00/39844 | 7/2000 |
| WO | WO - 01/13417 | 2/2001 |
| WO | WO - 01/17006 | 3/2001 |
| WO | WO - 03/020839 | 3/2003 |
| WO | WO - 03/104350 | 12/2003 |
| WO | WO - 2005/031836 | 4/2005 |

* cited by examiner

POLISHING COMPOSITION AND POLISHING METHOD

BACKGROUND OF THE INVENTION

The present invention relates to a polishing composition for use, for example, in polishing for forming conductive wiring in a semiconductor device, and a polishing method using such a polishing composition.

Conductive wiring in a semiconductor device is at present mainly produced by a damascene process, which is based on a chemical mechanical polishing (CMP) technique. For producing conductive wiring, trenches are first formed on an insulating layer of insulating material (e.g., $SiO_2$), provided on a semiconductor board. Next, a conductive layer of conductive metal (e.g., Cu) is provided on the insulating layer so as to at least fill up the trenches. Then, the portion of the conductive layer, which is positioned outside the trenches, is removed by polishing. As a result, the portion of the conductive layer, which is positioned in the trenches, remains on the insulating layer acts as conductive wiring.

Polishing for removing the portion of the conductive layer, which is positioned outside the trenches, is generally carried out with a polishing composition that contains an abrasive grain, an oxidant, and an agent for forming a protective film. The polishing compositions disclosed in International Publication No. WO00/13217, Japanese Laid-Open Patent Publication No. 8-83780, and Japanese Laid-Open Patent Publication No. 11-21546 contain an agent for forming a protective film, including a nitrogen compound such as ammonia, benzotriazole and a surfactant. The polishing composition disclosed in Japanese Laid-Open Patent Publication No. 7-233485 contains an organic acid such as aminoacetic acid, and an oxidant.

CMP for removing the portion of the conductive layer, which is positioned outside the trenches, is generally carried out in two stages to enhance efficiency, i.e., a preliminary polishing step for polishing a subject to be polished with a high stock removal rate and a finish polishing step for finish-polishing the subject to be polished so that a favorable surface qualities can be obtained. The preliminary polishing step using a polishing composition for the preliminary polishing step and the finish polishing step using a polishing composition for the finish polishing step are generally continuously carried out using a single polishing machine equipped with a plurality of polishing turntables. Therefore, the polishing composition for the finish polishing step may be left adhere to the polishing machine and the remained polishing composition for the finish polishing step may mixed into the polishing composition for the preliminary polishing step in the subsequent polishing cycle. Some polishing compositions for the finish polishing step contain an agent for forming a protective film such as benzotriazole or polyvinyl pyrrolidone. When the polishing composition for the finish polishing step is mixed into the polishing composition for the preliminary polishing step, a protective film is formed on the conductive layer by the action of the agent for forming a protective film in the polishing composition for the finish polishing step, causing a significant deterioration in the stock removal rate in the preliminary polishing step. Moreover, since the amount of contamination varies from cycle to cycle, and the degree of deterioration in the stock removal rate in the preliminary polishing step fluctuates from cycle to cycle, causing a variant stock removal rate in the preliminary polishing.

SUMMARY OF THE INVENTION

It is an object of the present invention to provide a polishing composition that can be suitably used in polishing for forming conductive wiring in a semiconductor device. It is another object of the present invention to provide a polishing method using such a polishing composition.

To achieve the foregoing and other objectives and in accordance with the purposes of the present invention, the present invention provides a polishing composition. The polishing composition contains a deterioration inhibitor for inhibiting deterioration of polishing capability of the polishing composition, an abrasive, and water, where the deterioration inhibitor is at least one selected from a polysaccharide and polyvinyl alcohol.

The present invention also provides a polishing method that includes preparing the above polishing composition and polishing a subject to be polished using the prepared polishing composition in order to form wiring in a semiconductor device.

Other aspects and advantages of the invention will become apparent from the following description, illustrating by way of example the principle of the invention.

BRIEF DESCRIPTION OF THE DRAWINGS

The invention, together with objects and advantages thereof, may best be understood by reference to the following description of the presently preferred embodiments together with the accompanying drawing, in which.

DETAILED DESCRIPTION OF THE PREFERRED EMBODIMENTS

One embodiments of the present invention will now be described.

Figure 1:
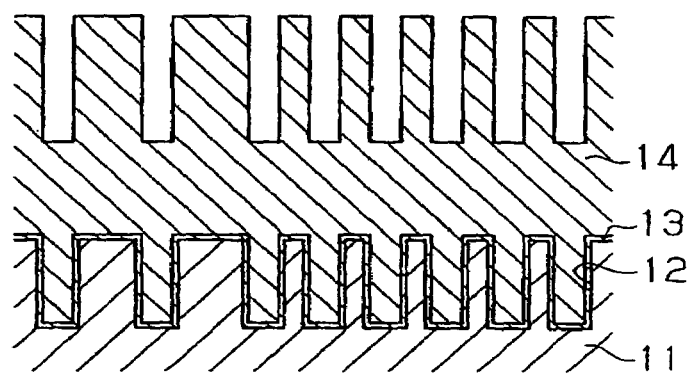
FIGS. 1(a) to 1(d) are cross sectional views of a subject to be polished for explaining a polishing method according to one embodiment of the present invention.
Figure 1:
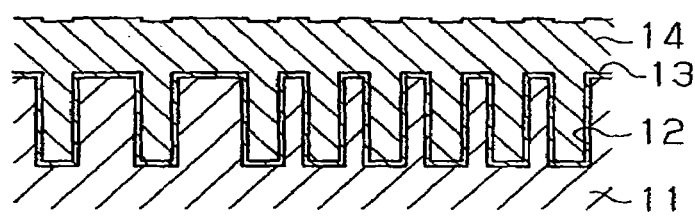
Figure 1:
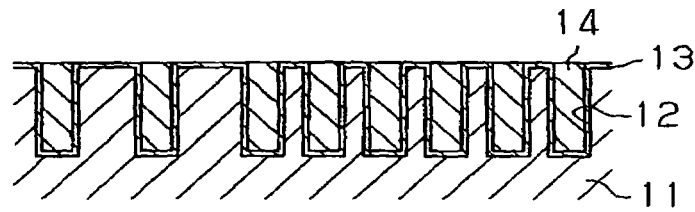
Figure 1:
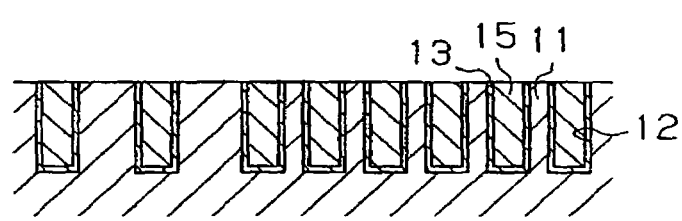

First, a method for forming conductive wiring in a semiconductor device will be described. In forming conductive wiring in a semiconductor device, as illustrated in FIG. 1(a), a barrier film 13 and a conductive film 14 are first formed on an insulating film 11 having trenches 12.

The insulating layer 11 may be made of $SiO_2$, SiOF or SiOC. The insulating layer 11 is formed by the Chemical Vapor Deposition (CVD) using tetraethoxy silane (TEOS), borosilicate glass (BSG), phosphosilicate glass (PSG) or boron phosphosilicate glass (BPSG). The trenches 12 are formed for example by the known lithography and pattern etching techniques so as to have a prescribed design pattern.

The barrier layer 13 is formed on the insulating layer 11 so as to cover the surface thereof in advance of formation of the conductive layer 14, serves to prevent metal atoms in the conductive layer 14 from diffusion in the insulating layer 11. The barrier layer 13 is formed, for example, by the Physical Vapor Deposition (PVD) or CVD. It is preferred that the thickness of the barrier layer 13 be sufficiently smaller than the depth of the trench 12. The barrier layer 13 may be made of a tantalum-containing compound such as tantalum nitride, tantalum, or a tantalum alloy, or titanium-containing compound such as titanium nitride, titanium, or a titanium alloy.

The conductive layer 14 is formed on the barrier layer 13 so as to at least fill up the trenches 12. The conductive layer 14 is formed, for example, by PVD, CVD or plating. The conductive layer 14 is made of an conductive metal, such as tungsten, copper, or aluminum.

Then, the portions of the conductive layer 14 and barrier layer 13 positioned outside the trenches 12 are removed by CMP. As a result, as illustrated in FIG. 1(d), the portions of the barrier layer 13 and the conductive layer 14 in the trenches 12 remain on the insulating layer 11, and the remained portion of the conductive layer 14 acts as the conductive wiring 15.

CMP process for removing the portions of the conductive layer 14 and barrier layer 13 positioned outside the trenches 12 is generally comprises, a first, second and third polishing step. The first polishing step removes a part of the portion of the conductive layer 14 positioned outside the trenches 12 by CMP, as illustrated in FIG. 1(b). Polishing in the first polishing step is terminated before the barrier layer 13 is exposed. The subsequent second polishing step removes part of the remaining conductive layer 14 positioned outside the trenches 12 by CMP to expose the top surface of the barrier layer 13, as illustrated in FIG. 1(c). Then, the subsequent third polishing step removes the remaining portion of the conductive layer 14 and barrier layer 13 positioned outside the trenches 12 by CMP to expose the top surface of the insulating layer 11, as illustrated in FIG. 1(d).

A single polishing machine carries out the first to third steps for the CMP process continuously. The machine is equipped with a supporting stage for supporting a subject to be polished and a plurality of polishing turntable. The supporting stage is equipped with a plurality of supporting members in which subjects to be polished are fit, and the supporting stage is rotationally supported by the polishing machine. A polishing pad is affixed to each of the polishing turntable. When a subject to be polished is polished using the polishing machine, in a state that the subject to be polished fitted in the supporting stage is pressed against the polishing pad, the supporting stage and polishing turntable are rotated relative to each other while the polishing composition is supplied to the polishing pad. On completion of the first polishing step, the supporting stage rotates in such a way to transfer the subject to be polished to the polishing position for the second polishing step, and so is the stage, on completion of the second polishing step, to transfer the work to the polishing position for the third polishing step.

While a polishing composition of the present embodiment may be used in any of the first to third polishing steps, it is preferred that the polishing step be used in the first polishing step for polishing to remove part of the portion of the conductive layer 14 positioned outside the trenches 12. The polishing composition contains a deterioration inhibitor, an abrasive, and water.

The deterioration inhibitor contained in the polishing composition acts to inhibit deterioration of capability of the polishing composition for polishing the conductive layer 14, resulting from contamination with other polishing compositions as those used in the second or third polishing step. The deterioration inhibitor in the polishing composition is at least one selected from polysaccharide and polyvinyl alcohol. The polysaccharide may be a stored polysaccharide such as starch, amylopectin or glycogen; structural polysaccharide such as cellulose, pectin or hemicellulose; or extracellular polysaccharide such as pullulan or elsinan. Among them, pullulan is preferable, since pullulan has a stronger action of inhibiting deterioration of capability of the polishing composition for polishing the conductive layer 14 and also has an action of stabilizing capability of the polishing composition for polishing the conductive layer 14.

The content of the deterioration inhibitor in the polishing composition is preferably 0.01% by mass or more, more preferably 0.05% or more, in view of strongly inhibiting the deterioration of the capability of the polishing composition for polishing the conductive layer 14. At the same time, the content of the deterioration inhibitor is preferably 10% by mass or less, more preferably 5% by mass or less, in view of stabilizing the capability of the polishing composition for polishing the conductive layer 14.

The abrasive contained in the polishing composition acts to mechanically polish the subject to be polished. The abrasive to be contained in the polishing composition is preferably at least one selected from aluminum oxide and silicon dioxide, because of their particularly high capability for mechanically polishing a subject to be polished. The abrasive is preferably at least one selected from fumed silica, fumed alumina, and colloidal silica, since they reduce the occurrence of scratches and thereby enhance quality of the surface of the subject to be polished after polishing.

The average particle diameter of the abrasive, which is found form its particle density and the specific surface area thereof determined by the BET method, is preferably 10 nm or more, more preferably 20 nm or more, in view of enhancing the capability of the polishing composition for polishing the conductive layer 14. Meanwhile, the average particle diameter of the abrasive is preferably 200 nm or less, more preferably 120 nm or less, in view of inhibiting agglomeration of the abrasive particles to enhance dispersion stability of the polishing composition. Setting the average particle diameter of the abrasive in the above-mentioned range is particularly effective when the abrasive is silicon dioxide, such as fumed silica or colloidal silica.

The content of the abrasive in the polishing composition is preferably 0.1% by mass or more, more preferably 0.5% by mass or more, in view of enhancing capability of the polishing composition for polishing the conductive layer 14. Meanwhile, the content of the abrasive is preferably 10% by mass or less, more preferably 5% by mass or less, in view of inhibiting agglomeration of the abrasive particles to enhance dispersion stability of the polishing composition.

Water in the polishing composition serves to dissolve or disperse therein other components in the polishing composition. It is preferred that the water contain the smallest possible amount of impurities so as not to disturb other components. Specifically, pure water, ultrapure water, or distilled water is preferable.

The polishing composition may further contain an oxidant. The oxidant oxidizes the surface of the conductive layer 14 to accelerate mechanical polishing of the conductive layer 14 with an abrasive. The oxidant contained in the polishing composition may be hydrogen peroxide, persulfic acid, periodic acid, perchloric acid, peracetic acid, performic acid, nitric acid, or a salt thereof. Among them, hydrogen peroxide is preferable, since hydrogen peroxide is less expensive, easily available, and contains only a small amount of metallic impurities. The number of types of the oxidant in the polishing composition may be one or two or more.

The content of the oxidant in the polishing composition is preferably 0.1% by mass or more, more preferably 1% by mass or more, in view of enhancing capability of the polishing composition for polishing the conductive layer 14. Meanwhile, the content of the oxidant is preferably 10% by mass or less, more preferably 5% by mass or less, since no further improvement in the capability of the polishing composition for polishing the conductive layer 14 can be expected, even if the oxidant is excessively added.

The polishing composition may further contain a chelating agent. The chelating agent has an action of accelerating polishing of the conductive layer 14 by capturing metallic particles generated in the polishing composition as a result of polishing the conductive layer 14. The chelating agent is preferably at least one selected from α-amino acid and organic acid, since α-amino acid and organic acid are easily available and have a strong chelating action. The α-amino acid may be a neutral acid such as glycine, alanine, valine, leucine, isoleucine, alloisoleucine, serine, threonine, allothreonine, cysteine, methionine, phenylalanine, tryptophan, tyrosine, proline and cystine; a basic amino-acid such as arginine and histidine; or an acidic amino acid such as glutamic acid and asparaginic acid. Among them, at least one selected from glycine and α-alanine is preferable, because of their particularly high capability of accelerating polishing of the conductive layer 14. The α-amino acid may be an L- or D-isomer as enantiomers with each other, or a mixture thereof. Examples of the organic acids include oxalic acid, citric acid, succinic acid, maleic acid, tartaric acid, 2-quinolinecarboxylic acid (quinaldic acid), 2-pyridinecarboxylic acid, 2,6-pyridinecarboxylic acid, or quinoic acid. The number of types of the chelating agent in the polishing composition may be one or two or more.

The content of the chelating agent in the polishing composition is preferably 0.01% by mass or more, more preferably 0.1% by mass or more, in view of enhancing capability of the polishing composition for polishing the conductive layer 14. Meanwhile, the content of the chelating agent is preferably 20% by mass or less, more preferably 10% by mass or less, since no further improvement in the capability of the polishing composition for polishing the conductive layer 14 can be expected, even if the chelating agent is excessively added.

The polishing composition may further contain a corrosion inhibitor. The corrosion inhibitor forms a protective film over the surface of the conductive layer 14 to protect the conductive layer 14 from corrosion by the oxidant, thereby inhibiting surface defects, such as surface roughness and pits, to enhance quality of the surface of the subject to be polished after polishing. The corrosion inhibitor also acts to reduce surface irregularities on the polished surface. The corrosion inhibitor to be contained in the polishing composition may be benzotriazole, benzoimidazole, triazole, imidazole, tollyltriazole, or a derivative or salt thereof. Among them, at least one selected from benzotriazole and a derivative thereof is preferable, because of their strong corrosion inhibiting action. The number of types of the corrosion inhibitors in the polishing composition may be one or two or more.

The content of the corrosion inhibitor in the polishing composition is preferably 0.0001% by mass or more in view of enhancing quality of the surface of the subject to be polished after polishing and reducing surface irregularities. Meanwhile, it is preferably 0.02% by mass or less, more preferably 0.01% by mass or less, since when the content of the corrosion inhibitor in the polishing composition is 0.02% by mass or less, or further, when the content is 0.01% by mass or less, even if a corrosion inhibitor in other polishing compositions mixes into the polishing composition of the present embodiment, deterioration of capability of the polishing composition for polishing the conductive layer 14 due to excessive inclusion of corrosion inhibitors can be inhibited.

The polishing composition may further contain as required a thickening agent, emulsifier, rust-inhibitor, preservative, fungicide, defoaming agent, pH adjusting agent, surfactant or the like.

The polishing composition may be stored in a state where the components other than the water are concentrated, and the polishing composition may be diluted with water before use. This facilitates storage of the polishing composition and improves its transportation efficiency.

When the polishing composition of the present embodiment contains an oxidant, the polishing composition may be prepared and stored with the oxidant separated from other components. In this case, the polishing composition is prepared by mixing the oxidant with other components immediately before use of the polishing composition. This can prevent decomposition of the oxidant in the polishing composition during storage-thereof.

The present embodiment has the following advantages.

Since a deterioration inhibitor is contained in a polishing composition of the present embodiment, even if other polishing compositions, for example, as those used in the second or third polishing step are mixed into the polishing composition, deterioration of the capability of the polishing composition of the present embodiment can be inhibited. Consequently, it can increase throughput in the semiconductor device production and reduce its production cost.

A polishing composition to be used in the second or third polishing step generally contains, in addition to an abrasive and a component which plays a role of accelerating polishing, a component which plays a role of enhancing quality of the surface of the subject to be polished after polishing. A corrosion inhibitor is one example of the component that plays the role of enhancing quality of the surface. A corrosion inhibitor acts to form a protective film on the conductive layer 14 to protect the conductive layer 14 from corrosion, and in addition to the role, it plays another role of inhibiting the occurrence of a phenomenon called dishing in which the top surface level of the conductive wiring 15 lowers, and a phenomenon called erosion in which the top surface level of the area where trenches 12 are densely formed lowers. In the case where a polishing composition contains no deterioration inhibitor, its capability for polishing the conductive layer 14 deteriorates when contaminated with a corrosion inhibitor even in a small quantity. By contrast, with the polishing composition of the present embodiment, no deterioration of the capability for polishing the conductive layer 14 occurs even if a given amount of corrosion inhibitor is mixed therein.

Furthermore, when a semiconductor device has multi-layered wiring, formation of an insulating layer 11, barrier layer 13 and conductive layer 14, and removal of part of the conductive layer 14 and part of barrier layer 13 are repeated. The polishing composition of the present embodiment can inhibit deterioration of its capability for polishing the conductive layer 14, even if contaminated with a polishing composition which was used for forming an under layer wiring.

Next, examples and comparative examples of the present invention will be described.

Table 1 provides compositions that were mixed with water to prepare polishing composition according to each of Examples 1 to 21 and Comparative Examples 1 to 20. Table 1 also provides pH of each of the polishing composition according to each of Examples 1 to 21 and Comparative Examples 1 to 20.

TABLE 1

| | Deterioration inhibitor or its alternate compound [mass percentage] | Abrasive [mass percentage] | Chelating agent [mass percentage] | Corrosion inhibitor [mass percentage] | Oxidant [mass percentage] | pH |
|---|---|---|---|---|---|---|
| Ex. 1 | pullulan 0.1% | colloidal silica*[1] 1% | glycine 0.9% | BTA 0.005% | hydrogen peroxide 3% | 6.8 |
| Ex. 2 | pullulan 0.1% | colloidal silica*[1] 1% | alanine 0.9% | BTA 0.005% | hydrogen peroxide 3% | 6.8 |
| Ex. 3 | pullulan 0.1% | colloidal silica*[1] 1% | quinaldic acid 1% | BTA 0.005% | hydrogen peroxide 3% | 7.1 |
| Ex. 4 | pullulan 0.1% | colloidal silica*[2] 1% | glycine 0.9% | BTA 0.005% | hydrogen peroxide 3% | 6.8 |
| Ex. 5 | pullulan 0.1% | fumed silica 1% | glycine 0.9% | BTA 0.005% | hydrogen peroxide 3% | 6.8 |
| Ex. 6 | pullulan 0.1% | fumed alumina 1% | glycine 0.9% | BTA 0.005% | hydrogen peroxide 3% | 6.8 |
| Ex. 7 | PVA*[1] 0.1% | colloidal silica*[1] 1% | glycine 0.9% | BTA 0.005% | hydrogen peroxide 3% | 6.8 |
| Ex. 8 | PVA*[1] 0.1% | colloidal silica*[1] 1% | alanine 0.9% | BTA 0.005% | hydrogen peroxide 3% | 6.8 |
| Ex. 9 | PVA*[1] 0.1% | colloidal silica*[1] 1% | quinaldic acid 1% | BTA 0.005% | hydrogen peroxide 3% | 7.1 |
| Ex. 10 | PVA*[1] 0.1% | colloidal silica*[2] 1% | glycine 0.9% | BTA 0.005% | hydrogen peroxide 3% | 6.8 |
| Ex. 11 | PVA*[1] 0.1% | fumed silica 1% | glycine 0.9% | BTA 0.005% | hydrogen peroxide 3% | 6.8 |
| Ex. 12 | PVA*[1] 0.1% | fumed alumina 1% | glycine 0.9% | BTA 0.005% | hydrogen peroxide 3% | 6.8 |
| Ex. 13 | pullulan 0.01% | colloidal silica*[1] 1% | glycine 0.9% | BTA 0.005% | hydrogen peroxide 3% | 6.8 |
| Ex. 14 | pullulan 0.05% | colloidal silica*[1] 1% | glycine 0.9% | BTA 0.005% | hydrogen peroxide 3% | 6.8 |
| Ex. 15 | pullulan 0.5% | colloidal silica*[1] 1% | glycine 0.9% | BTA 0.005% | hydrogen peroxide 3% | 6.8 |
| Ex. 16 | pullulan 5% | colloidal silica*[1] 1% | glycine 0.9% | BTA 0.005% | hydrogen peroxide 3% | 6.8 |
| Ex. 17 | PVA*[1] 0.01% | colloidal silica*[1] 1% | glycine 0.9% | BTA 0.005% | hydrogen peroxide 3% | 6.8 |
| Ex. 18 | PVA*[1] 0.05% | colloidal silica*[1] 1% | glycine 0.9% | BTA 0.005% | hydrogen peroxide 3% | 6.8 |
| Ex. 19 | PVA*[1] 0.5% | colloidal silica*[1] 1% | glycine 0.9% | BTA 0.005% | hydrogen peroxide 3% | 6.8 |
| Ex. 20 | PVA*[1] 5% | colloidal silica*[1] 1% | glycine 0.9% | BTA 0.005% | hydrogen peroxide 3% | 6.8 |
| Ex. 21 | PVA*[2] 0.1% | colloidal silica*[1] 1% | glycine 0.9% | BTA 0.005% | hydrogen peroxide 3% | 6.8 |
| C. Ex. 1 | — | colloidal silica*[1] 1% | glycine 0.9% | BTA 0.005% | hydrogen peroxide 3% | 6.8 |
| C. Ex. 2 | — | colloidal silica*[1] 1% | alanine 0.9% | BTA 0.005% | hydrogen peroxide 3% | 6.8 |
| C. Ex. 3 | — | colloidal silica*[1] 1% | quinaldic acid 1% | BTA 0.005% | hydrogen peroxide 3% | 7.1 |
| C. Ex. 4 | — | colloidal silica*[2] 1% | glycine 0.9% | BTA 0.005% | hydrogen peroxide 3% | 6.8 |
| C. Ex. 5 | — | fumed silica 1% | glycine 0.9% | BTA 0.005% | hydrogen peroxide 3% | 6.8 |
| C. Ex. 6 | — | fumed alumina 1% | glycine 0.9% | BTA 0.005% | hydrogen peroxide 3% | 6.8 |
| C. Ex. 7 | PEG*[1] 1% | colloidal silica*[1] 1% | glycine 0.9% | BTA 0.005% | hydrogen peroxide 3% | 6.8 |
| C. Ex. 8 | PEG*[1] 1% | colloidal silica*[1] 1% | alanine 0.9% | BTA 0.005% | hydrogen peroxide 3% | 6.8 |
| C. Ex. 9 | PEG*[1] 1% | colloidal silica*[1] 1% | quinaldic acid 1% | BTA 0.005% | hydrogen peroxide 3% | 7.1 |
| C. Ex. 10 | PEG*[1] 1% | colloidal silica*[2] 1% | glycine 0.9% | BTA 0.005% | hydrogen peroxide 3% | 6.8 |
| C. Ex. 11 | PEG*[1] 1% | fumed silica 1% | glycine 0.9% | BTA 0.005% | hydrogen peroxide 3% | 6.8 |
| C. Ex. 12 | PEG*[1] 1% | fumed alumina 1% | glycine 0.9% | BTA 0.005% | hydrogen peroxide 3% | 6.8 |
| C. Ex. 13 | PEG*[2] 1% | colloidal silica*[1] 1% | glycine 0.9% | BTA 0.005% | hydrogen peroxide 3% | 6.8 |
| C. Ex. 14 | PEG*[2] 1% | colloidal silica*[1] 1% | alanine 0.9% | BTA 0.005% | hydrogen peroxide 3% | 6.8 |
| C. Ex. 15 | PEG*[2] 1% | colloidal silica*[1] 1% | quinaldic acid 1% | BTA 0.005% | hydrogen peroxide 3% | 7.1 |
| C. Ex. 16 | PEG*[2] 1% | colloidal silica*[2] 1% | glycine 0.9% | BTA 0.005% | hydrogen peroxide 3% | 6.8 |
| C. Ex. 17 | PEG*[2] 1% | fumed silica 1% | glycine 0.9% | BTA 0.005% | hydrogen peroxide 3% | 6.8 |
| C. Ex. 18 | PEG*[2] 1% | fumed alumina 1% | glycine 0.9% | BTA 0.005% | hydrogen peroxide 3% | 6.8 |
| C. Ex. 19 | polyacrylic acid 0.2% | colloidal silica*[1] 1% | glycine 0.9% | BTA 0.005% | hydrogen peroxide 3% | 6.8 |
| C. Ex. 20 | ammonium lauryl sulfate 0.2% | colloidal silica*[1] 1% | glycine 0.9% | BTA 0.005% | hydrogen peroxide 3% | 6.8 |

In the column "Deterioration inhibitor or its alternate compound" in Table 1:

"pullulan" represents pullulan having an average molecular weight of 200,000;

"PVA*[1]" represents polyvinyl alcohol having an average molecular weight of 100,000;

"PVA*[2]" represents polyvinyl alcohol having an average molecular weight of 10,000;

"PEG*[1]" represents polyethylene glycol having an average molecular weight of 600;

"PEG*[2]" represents polyethylene glycol having an average molecular weight of 2,000; and "polyacrylic acid" represents polyacrylic acid having an average molecular weight of 1,000.

In the column "Abrasive" in Table 1:

"colloidal silica*[1]" represents colloidal silica having an average particle diameter of 35 nm;

"colloidal silica*[2]" represents colloidal silica having an average particle diameter of 10 nm;

"fumed silica" represents fumed silica having an average particle diameter of 30 nm; and "fumed alumina" represents fumed alumina having an average particle diameter of 30 nm. The average particle diameter of colloidal silica, fumed silica, and fumed alumina were found from particle density and specific surface area measurements using a "FlowSorbII2300", manufactured by Micromeritics Instrument Corporation.

In the column "Corrosion inhibitor" in Table 1:

"BTA" represents benzotriazole.

A copper blanket wafer was polished with the polishing composition prepared in each of Examples 1 to 21 and Comparative Examples 1 to 20 under the polishing conditions described below. A copper blanket wafer was an 8-inch silicon wafer coated with a copper film by electroplating method. The thickness of each copper blanket wafer was measured before and after polishing by a sheet resistance device "VR-120" manufactured by Kokusai Electric System Service Co., Ltd., to determine its stock removal rate by the following calculation formula. The results are given in the column "No addition of additives" in the column "Stock removal rate" in Table 2.

<Polishing Condition>

Polishing machine: Single-sided polishing machine for CMP, "Mirra" manufactured by Applied Materials Inc.

Polishing pad: Laminated polishing pad of polyurethane "IC-1000/Suba400" manufactured by Rodel Inc.

Polishing pressure: 28 kPa (=about 2 psi)

Turntable rotation speed: 100 revolution/minute

Polishing composition supplied speed: 200 ml/minute
Carrier rotation speed: 100 revolution/minute
Polishing time: 1 minute <Calculation Formula>

Stock removal rate [nm/minute]=(thickness of copper blanket wafer before polishing [nm]−thickness of copper blanket wafer after polishing [nm])÷polishing time [minute]

To the polishing composition of Examples 1 to 21 and Comparative Examples 1 to 20 was added benzotriazole so as to make the content 0.01% by mass. Then, the copper blankets were polished using the polishing compositions to which benzotriazole was added under the above-mentioned polishing conditions. The stock removal rates by these polishing compositions for the copper blanket wafer are given in the column "BTA*[1]" in the column "Stock removal rate" in Table 2.

To the polishing composition of Examples 1 to 21 and Comparative Examples 1 to 20 was added benzotriazole so as to make the content 0.02% by mass. Then, the copper blankets were polished using the polishing compositions to which benzotriazole was added under the above-mentioned polishing conditions. The stock removal rates by these polishing compositions for the copper blanket wafer are given in the column "BTA*[2]" in the column "Stock removal rate" in Table 2.

To the polishing composition of Examples 1 to 21 and Comparative Examples 1 to 20 was added polyvinylpyrrolidone having an average molecular weight of 10,000 so as to make the content 0.1% by mass. Then, the copper blankets were polished using the polishing compositions to which polyvinylpyrrolidone was added under the above-mentioned polishing conditions. The stock removal rates by these polishing compositions for the copper blanket wafer are given in the column "PVP" in the column "Stock removal rate" in Table 2.

To the polishing composition of Examples 1 to 21 and Comparative Examples 1 to 20 was added lactic acid so as to make the content 0.1% by mass. Then, the copper blankets were polished using the polishing compositions to which lactic acid was added under the above-mentioned polishing conditions. The stock removal rates by these polishing compositions for the copper blanket wafer are given in the column "lactic acid" in the column "Stock removal rate" in Table 2.

In order to numerically express the effect of the addition of benzotriazole, polyvinylpyrrolidone or lactic acid on the polishing capability of the polishing composition, the stock removal rate of the polishing composition before the addition of the additives was divided by the stock removal rate of the polishing composition after the addition of the additives to obtain the maintenance ratio of the polishing capability. The polishing capability maintenance ratio of each composition when benzotriazole was added in such a way to make the content 0.01% by mass, is given in the column "BTA*[1]" of the column "Polishing capability maintenance ratio" in Table 2. The polishing capability maintenance ratio of each composition when benzotriazole was added in such a way to make the content 0.02% by mass, is given in the column "BTA*[2]" of the column "Polishing capability maintenance ratio" in Table 2. The polishing capability maintenance ratio of each composition when polyvinylpyrrolidone was added in such a way to make the content 0.1% by mass, is given in the column "PVP" of the column "Polishing capability maintenance ratio" in Table 2. The polishing capability maintenance ratio of each composition when lactic acid was added in such a way to make the content 0.1% by mass, is given in the column "lactic acid" of the column "Polishing capability maintenance ratio" in Table 2.

TABLE 2

| | Stock removal rate [nm/min] | | | | | Polishing capability maintenance ratio [%] | | | |
|---|---|---|---|---|---|---|---|---|---|
| | No addition | BTA*[1] | BTA*[2] | PVP | lactic acid | BTA*[1] | BTA*[2] | PVP | lactic acid |
| Ex. 1 | 800 | 550 | 400 | 700 | 810 | 0.69 | 0.50 | 0.88 | 1.01 |
| Ex. 2 | 370 | 270 | 210 | 330 | 380 | 0.73 | 0.57 | 0.89 | 1.03 |
| Ex. 3 | 340 | 230 | 190 | 320 | 320 | 0.68 | 0.56 | 0.94 | 0.94 |
| Ex. 4 | 690 | 480 | 330 | 650 | 670 | 0.70 | 0.48 | 0.94 | 0.97 |
| Ex. 5 | 750 | 530 | 350 | 670 | 750 | 0.71 | 0.47 | 0.89 | 1.00 |
| Ex. 6 | 770 | 520 | 370 | 700 | 750 | 0.68 | 0.48 | 0.91 | 0.97 |
| Ex. 7 | 800 | 600 | 450 | 730 | 790 | 0.75 | 0.56 | 0.91 | 0.99 |
| Ex. 8 | 500 | 410 | 290 | 450 | 520 | 0.82 | 0.58 | 0.90 | 1.04 |
| Ex. 9 | 330 | 220 | 190 | 300 | 320 | 0.67 | 0.58 | 0.91 | 0.97 |
| Ex. 10 | 710 | 480 | 310 | 640 | 720 | 0.68 | 0.44 | 0.90 | 1.01 |
| Ex. 11 | 800 | 550 | 330 | 670 | 790 | 0.69 | 0.41 | 0.84 | 0.99 |
| Ex. 12 | 800 | 540 | 360 | 650 | 800 | 0.68 | 0.45 | 0.81 | 1.00 |
| Ex. 13 | 800 | 490 | 340 | 680 | 800 | 0.61 | 0.43 | 0.85 | 1.00 |
| Ex. 14 | 800 | 530 | 370 | 690 | 810 | 0.66 | 0.46 | 0.86 | 1.01 |
| Ex. 15 | 800 | 510 | 410 | 700 | 810 | 0.64 | 0.51 | 0.88 | 1.01 |
| Ex. 16 | 800 | 400 | 320 | 720 | 820 | 0.50 | 0.40 | 0.90 | 1.03 |
| Ex. 17 | 800 | 590 | 430 | 680 | 810 | 0.74 | 0.54 | 0.85 | 1.01 |
| Ex. 18 | 800 | 600 | 450 | 690 | 820 | 0.75 | 0.56 | 0.86 | 1.03 |
| Ex. 19 | 800 | 620 | 460 | 700 | 820 | 0.78 | 0.58 | 0.88 | 1.03 |
| Ex. 20 | 800 | 510 | 390 | 700 | 810 | 0.64 | 0.49 | 0.88 | 1.01 |
| Ex. 21 | 800 | 530 | 400 | 680 | 810 | 0.64 | 0.49 | 0.85 | 1.01 |
| C. Ex. 1 | 800 | 200 | 120 | 410 | 310 | 0.25 | 0.15 | 0.51 | 0.39 |
| C. Ex. 2 | 370 | 190 | 100 | 300 | 180 | 0.51 | 0.27 | 0.81 | 0.49 |
| C. Ex. 3 | 340 | 120 | 80 | 250 | 150 | 0.35 | 0.24 | 0.74 | 0.44 |
| C. Ex. 4 | 620 | 180 | 110 | 350 | 210 | 0.29 | 0.18 | 0.56 | 0.34 |
| C. Ex. 5 | 780 | 200 | 120 | 350 | 300 | 0.26 | 0.15 | 0.45 | 0.38 |
| C. Ex. 6 | 760 | 210 | 120 | 340 | 300 | 0.28 | 0.16 | 0.45 | 0.39 |
| C. Ex. 7 | 600 | 200 | 150 | 350 | 250 | 0.33 | 0.25 | 0.58 | 0.42 |
| C. Ex. 8 | 330 | 100 | 80 | 280 | 170 | 0.30 | 0.24 | 0.85 | 0.52 |

TABLE 2-continued

|  | Stock removal rate [nm/min] | | | | Polishing capability maintenance ratio [%] | | | |
| --- | --- | --- | --- | --- | --- | --- | --- | --- |
|  | No addition | BTA*1 | BTA*2 | PVP | lactic acid | BTA*1 | BTA*2 | PVP | lactic acid |
| C. Ex. 9 | 350 | 80 | 60 | 270 | 180 | 0.23 | 0.17 | 0.77 | 0.51 |
| C. Ex. 10 | 550 | 180 | 120 | 320 | 240 | 0.33 | 0.22 | 0.58 | 0.44 |
| C. Ex. 11 | 600 | 170 | 120 | 310 | 240 | 0.28 | 0.20 | 0.52 | 0.40 |
| C. Ex. 12 | 610 | 180 | 130 | 310 | 240 | 0.30 | 0.21 | 0.51 | 0.39 |
| C. Ex. 13 | 270 | 120 | 80 | 150 | 110 | 0.44 | 0.30 | 0.56 | 0.41 |
| C. Ex. 14 | 150 | 120 | 80 | 70 | 60 | 0.80 | 0.53 | 0.47 | 0.40 |
| C. Ex. 15 | 330 | 70 | 50 | 140 | 120 | 0.21 | 0.15 | 0.42 | 0.36 |
| C. Ex. 16 | 250 | 100 | 50 | 120 | 90 | 0.40 | 0.20 | 0.48 | 0.36 |
| C. Ex. 17 | 270 | 120 | 60 | 120 | 100 | 0.44 | 0.22 | 0.44 | 0.37 |
| C. Ex. 18 | 280 | 120 | 60 | 120 | 100 | 0.43 | 0.21 | 0.43 | 0.36 |
| C. Ex. 19 | 250 | 150 | 100 | 110 | 80 | 0.60 | 0.40 | 0.44 | 0.32 |
| C. Ex. 20 | 500 | 250 | 130 | 280 | 210 | 0.50 | 0.26 | 0.56 | 0.42 |

As shown in Table 2, the polishing composition prepared in each of Examples 1 to 21 has a comparatively high polishing capability, and their stock removal rates do not comparatively lower with the addition of the additives. From the results of Examples 1, 4 to 7, and 10 to 12, it was found that by using colloidal silica having an average particle diameter of 35 nm as an abrasive, deterioration of stock removal rate can be particularly inhibited. From the results of Examples 1 to 3 and 7 to 9, it was found that by using glycine or alanine as a chelating agent, deterioration of stock removal rate by the addition of the additives can be inhibited, and that by using glycine as a chelating agent, deterioration of polishing capability by the addition of the additives can be particularly inhibited. From the results of Examples 7 and 21, it was found that the difference in molecular weight of polyvinyl alcohols having different molecular weights has substantially no effect on the polishing capability and the degree of deterioration in the stock removal rate by the addition of the additives. From the results of Comparative Examples 7 to 20, it was found that when polyethylene glycol or polyacrylic acid is used in place of a deterioration inhibitor, the degree of deterioration in the stock removal rate by the addition of additives is greater when compared with the polishing composition containing a deterioration inhibitor.

The invention claimed is:

1. A method for forming conductive wiring in a semiconductor device, comprising:
   preparing an object including an insulating layer having trenches and a conductive layer provided on the insulating layer, the conductive layer having a portion positioned outside the trenches and a portion positioned inside the trenches; and
   removing the portions of the conductive layer positioned outside the trenches, said removing includes:
   polishing the object to remove a part of the portion of the conductive layer positioned outside the trenches using a preliminary polishing composition containing a deterioration inhibitor for inhibiting deterioration of polishing capability of the polishing composition, an abrasive, and water, wherein the deterioration inhibitor is at least one compound selected from a polysaccharide and polyvinyl alcohol;
   polishing the object to remove the remaining portion of the conductive layer positioned outside the trenches using a finish polishing composition that is different from the preliminary polishing composition.

2. The method according to claim 1 wherein the finish polishing composition contains a corrosion inhibitor which forms a protective film on the surface of the conductive layer.

3. The method according to claim 1, wherein the polysaccharide is starch, amylopectin, glycogen, cellulose, pectin, hemicellulose, pullulan, or elsinan.

4. The method according to claim 1, wherein the content of the deterioration inhibitor in the preliminary polishing composition is 0.01 to 10% by mass.

5. The method according to claim 1, wherein the abrasive is at least one selected from fumed silica, fumed alumina, and colloidal silica.

6. The method according to claim 1, wherein the content of the abrasive in the preliminary polishing composition is 0.1 to 10% by mass.

7. The method according to claim 1, wherein the preliminary polishing composition further contains an oxidant.

8. The method according to claim 7, wherein the oxidant is hydrogen peroxide, persulfic acid, periodic acid, perchloric acid, peracetic acid, performic acid, nitric acid, or a salt thereof.

9. The method according to claim 1, wherein the preliminary polishing composition further contains a chelating agent.

10. The method according to claim 9, wherein the chelating agent is glycine, alanine, valine, leucine, isoleucine, alloisoleucine, serine, threonine, allotbreonine, cysteine, methionine, phenylalanine, tryptophan, tyrosine, proline, cystine, arginine, histidine, glutamic acid, asparaginic acid, oxalic acid, citric acid, succinic acid, maleic acid, tartaric acid, 2-quinolinecarboxylic acid, 2-pyridinecarboxylic acid, 2,6-pyridinecarboxylic acid, or quinoic acid.

11. The method according to claim 1, wherein the preliminary polishing composition further contains a corrosion inhibitor.

12. The method according to claim 11, wherein the corrosion inhibitor in the preliminary polishing composition is benzotriazole, benzoimidazole, triazole, imidazole, tollyltriazole, or a derivative or salt thereof.

13. The method according to claim 1, wherein the polishing of the object using the preliminary polishing composition and the polishing of the object using the finish polishing composition are carried out by one polishing machine.

* * * * *

UNITED STATES PATENT AND TRADEMARK OFFICE
CERTIFICATE OF CORRECTION

| | |
|---|---|
| PATENT NO. | : 7,550,388 B2 |
| APPLICATION NO. | : 11/085612 |
| DATED | : June 23, 2009 |
| INVENTOR(S) | : Junhui Oh et al. |

It is certified that error appears in the above-identified patent and that said Letters Patent is hereby corrected as shown below:

Title Page In Section (73) Assignee, please delete "Fujima" and replace with -- Fujimi --.

Signed and Sealed this

Twenty-second Day of June, 2010

David J. Kappos
*Director of the United States Patent and Trademark Office*